United States Patent
Wada et al.

(10) Patent No.: US 11,228,160 B2
(45) Date of Patent: Jan. 18, 2022

(54) ALGAINPAS-BASED SEMICONDUCTOR LASER DEVICE AND METHOD FOR PRODUCING SAME

(71) Applicant: SHARP KABUSHIKI KAISHA, Sakai (JP)

(72) Inventors: Kazuhiko Wada, Sakai (JP); Ryuhichi Sogabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 36 days.

(21) Appl. No.: 16/681,040

(22) Filed: Nov. 12, 2019

(65) Prior Publication Data

US 2020/0161837 A1 May 21, 2020

Related U.S. Application Data

(60) Provisional application No. 62/767,809, filed on Nov. 15, 2018.

(51) Int. Cl.
| | |
|---|---|
| *H01S 5/22* | (2006.01) |
| *H01S 5/30* | (2006.01) |
| *H01S 5/042* | (2006.01) |
| *H01S 5/343* | (2006.01) |
| *H01S 5/20* | (2006.01) |
| *H01S 5/028* | (2006.01) |
| *H01S 5/32* | (2006.01) |

(52) U.S. Cl.
CPC .......... *H01S 5/2214* (2013.01); *H01S 5/0421* (2013.01); *H01S 5/04252* (2019.08); *H01S 5/2009* (2013.01); *H01S 5/3063* (2013.01); *H01S 5/3072* (2013.01); *H01S 5/3436* (2013.01); *H01S 5/0287* (2013.01); *H01S 5/3213* (2013.01); *H01S 5/34333* (2013.01); *H01S 2304/04* (2013.01)

(58) Field of Classification Search
CPC .... H01S 5/3063; H01S 5/3072; H01S 5/0421; H01S 5/2009; H01S 5/3213
See application file for complete search history.

(56) References Cited

U.S. PATENT DOCUMENTS

| | | | | |
|---|---|---|---|---|
| 4,740,976 A | * | 4/1988 | Kajimura | B82Y 20/00 372/45.01 |
| 5,023,880 A | * | 6/1991 | Suzuki | H01S 5/2231 372/45.01 |

(Continued)

FOREIGN PATENT DOCUMENTS

| | | | | |
|---|---|---|---|---|
| AU | 2005204248 A1 | * | 9/2005 | .......... H01S 5/0421 |
| CN | 106684220 A | | 5/2017 | |

(Continued)

*Primary Examiner* — Joshua King
(74) *Attorney, Agent, or Firm* — ScienBiziP, P.C.

(57) ABSTRACT

An AlGaInPAs-based semiconductor laser device includes a substrate, an n-type clad layer, an n-type guide layer, an active layer, a p-type guide layer composed of AlGaInP containing Mg as a dopant, a p-type clad layer composed of AlInP containing Mg as a dopant, and a p-type cap layer composed of GaAs. Further, the semiconductor laser device has, between the p-type guide layer and the p-type clad layer, a Mg-atomic concentration peak which suppresses inflow of electrons, moving from the n-type clad layer to the active layer, into the p-type guide layer or the p-type clad layer.

6 Claims, 4 Drawing Sheets

(56) References Cited

U.S. PATENT DOCUMENTS

| | | | | |
|---|---|---|---|---|
| 5,828,685 A | * | 10/1998 | Duggan | H01S 5/20 372/45.01 |
| 5,987,047 A | * | 11/1999 | Valster | H01L 33/30 372/45.01 |
| 6,174,747 B1 | * | 1/2001 | Ho | H01S 5/04252 438/31 |
| 6,555,403 B1 | * | 4/2003 | Domen | B82Y 20/00 438/22 |
| 6,785,311 B1 | * | 8/2004 | Najda | B82Y 20/00 257/13 |
| 6,829,272 B1 | * | 12/2004 | Najda | H01S 5/20 372/45.01 |
| 7,826,506 B2 | * | 11/2010 | Johnson | H01S 5/04257 372/46.013 |
| 8,623,683 B2 | * | 1/2014 | Nago | H01L 33/32 438/45 |
| 2003/0020079 A1 | * | 1/2003 | Hata | H01L 33/145 257/85 |
| 2003/0025123 A1 | * | 2/2003 | Onishi | H01S 5/164 257/102 |
| 2003/0124756 A1 | * | 7/2003 | Garabedian | H01S 5/22 438/46 |
| 2003/0209771 A1 | * | 11/2003 | Akulova | H01S 5/227 257/432 |
| 2004/0119081 A1 | * | 6/2004 | Takemi | B82Y 20/00 257/85 |
| 2004/0124500 A1 | * | 7/2004 | Kawagoe | H01L 33/32 257/548 |
| 2004/0179563 A1 | * | 9/2004 | Hasegawa | H01S 5/343 372/43.01 |
| 2005/0058170 A1 | * | 3/2005 | Itoh | B82Y 20/00 372/44.01 |
| 2006/0176923 A1 | * | 8/2006 | Hanamaki | B82Y 20/00 372/45.01 |
| 2007/0045651 A1 | * | 3/2007 | Suzuki | H01L 33/02 257/102 |
| 2007/0246719 A1 | * | 10/2007 | Odawara | H01L 33/32 257/94 |
| 2008/0227233 A1 | * | 9/2008 | Hanamaki | H01S 5/0421 438/45 |
| 2008/0232415 A1 | * | 9/2008 | Imanishi | B82Y 20/00 372/45.01 |
| 2009/0010290 A1 | * | 1/2009 | Mayer | H01S 5/32 372/45.011 |
| 2009/0135875 A1 | * | 5/2009 | Ueda | B82Y 20/00 372/45.012 |
| 2009/0140273 A1 | * | 6/2009 | Takeuchi | B82Y 20/00 257/94 |
| 2010/0243988 A1 | * | 9/2010 | Kamikawa | H01L 33/16 257/13 |
| 2010/0290497 A1 | * | 11/2010 | Freund | H01S 5/305 372/50.1 |
| 2013/0009202 A1 | * | 1/2013 | Enya | H01L 33/14 257/103 |
| 2013/0182735 A1 | * | 7/2013 | Hagimoto | H01S 5/02212 372/45.01 |
| 2014/0225153 A1 | * | 8/2014 | Kawanishi | H01S 5/32341 257/103 |
| 2015/0349495 A1 | * | 12/2015 | Kinugawa | H01S 5/162 438/31 |
| 2018/0211919 A1 | | 7/2018 | Pan et al. | |
| 2019/0341524 A1 | | 11/2019 | Liu et al. | |

FOREIGN PATENT DOCUMENTS

| | | | | |
|---|---|---|---|---|
| CN | 108365062 A | | 8/2018 | |
| GB | 2351390 A | * | 12/2000 | H01S 5/32325 |
| JP | H10-135567 A | | 5/1998 | |
| JP | 2001352131 A | * | 12/2001 | H01S 5/227 |
| JP | 2003198045 A | * | 7/2003 | H01S 5/34333 |
| JP | 2005-093726 A | | 4/2005 | |
| JP | 2007096267 A | * | 4/2007 | B82Y 20/00 |
| JP | 2009135244 A | * | 6/2009 | B82Y 20/00 |
| KR | 100432762 B1 | * | 5/2004 | B82Y 20/00 |
| KR | 20080084541 A | * | 9/2008 | H01S 5/0421 |
| WO | WO-2009085050 A1 | * | 7/2009 | H01S 5/305 |
| WO | WO-2017195502 A1 | * | 11/2017 | H01L 33/145 |

* cited by examiner

ALGAINPAS-BASED SEMICONDUCTOR LASER DEVICE AND METHOD FOR PRODUCING SAME

TECHNICAL FIELD

The present invention relates to an AlGaInPAs-based semiconductor laser device and a method for producing the same.

BACKGROUND ART

Semiconductor laser devices are used as light sources of an optical disk and the like. For example, Patent Literature 1 discloses a semiconductor laser device including a p-type cap layer to which C is added, and a p-type clad layer to which Mg, Zn, or Be is added. Also, Patent Literature 2 discloses a semiconductor laser device including a p-type clad layer to which Mg is added, and a p-type contact layer to which C is added.

CITATION LIST

Patent Literature

[PTL 1] Japanese Unexamined Patent Application Publication No. 10-135567 (published on May 22, 1998)
[PTL 2] Japanese Unexamined Patent Application Publication No. 2005-093726 (published on Apr. 7, 2005)

SUMMARY OF INVENTION

Technical Problem

However, the semiconductor laser devices described above cause large current loss by an operation in high-temperature environment and thus cause a decrease in reliability with an increase in laser oscillation threshold value.

According to an aspect of the present invention, an AlGaInPAs-based semiconductor laser device is realized, which has excellent operating characteristics in a high-temperature environment while maintaining a low oscillation threshold value.

Solution to Problem

An AlGaInPAs-based semiconductor laser device according to an aspect of the present invention includes at least a substrate, an n-type clad layer, an n-type guide layer, an active layer, a p-type guide layer composed of AlGaInP containing Mg as a dopant, a p-type clad layer composed of AlInP containing Mg as a dopant, and a p-type cap layer composed of GaAs, and the laser device has, between the p-type guide layer and the p-type clad layer, a Mg-atomic concentration peak which suppresses inflow of electrons, moving from the n-type clad layer to the active layer, into the p-type guide layer or the p-type clad layer.

An AlGaInPAs-based semiconductor laser device according to an aspect of the present invention includes a p-type cap layer containing C as a dopant.

An AlGaInPAs-based semiconductor laser device according to an aspect of the present invention has a Mg-atomic concentration peak at the interface between a p-type guide layer and a p-type clad layer.

An AlGaInPAs-based semiconductor laser device according to an aspect of the present invention has a Mg-atomic concentration of $1.0 \times 10^{18}$ cm$^{-3}$ or more and $6.0 \times 10^{18}$ cm$^{-3}$ or less at the interface between a p-type guide layer and a p-type clad layer.

An AlGaInPAs-based semiconductor laser device according to an aspect of the present invention has a Mg-atomic concentration of $5.0 \times 10^{17}$ cm$^{-3}$ or less in an active layer.

An AlGaInPAs-based semiconductor laser device according to an aspect of the present invention has a Mg-atomic concentration of $3.0 \times 10^{18}$ cm$^{-3}$ or less at the interface between a p-type guide layer and an active layer.

A method for producing an AlGaInPAs-based semiconductor laser device according to an aspect of the present invention includes laminating at least an n-type clad layer, an n-type guide layer, and an active layer on a substrate, laminating a p-type guide layer composed of AlGaInP at a first temperature, laminating a p-type clad layer composed of AlInP, to which Mg is added as a dopant, at a second temperature lower than the first temperature, laminating a p-type cap layer composed of GaAs, to which C is added as a dopant, and annealing the laminated substrate.

DESCRIPTION OF EMBODIMENTS

Figure 1:
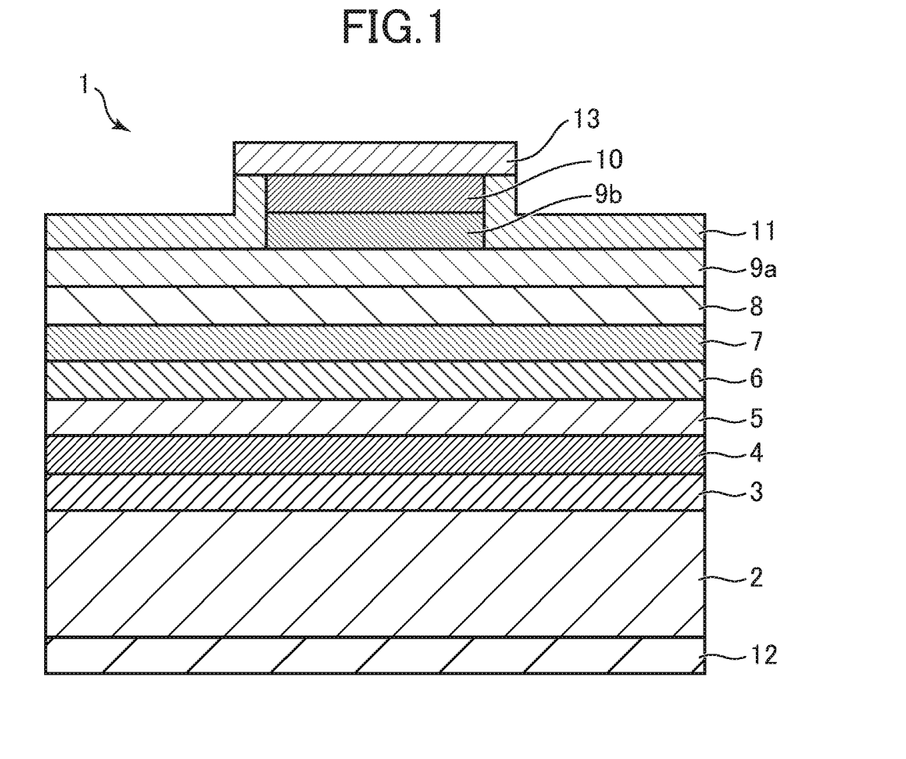
FIG. 1 is a sectional view schematically showing a configuration of a semiconductor laser device according to an embodiment of the present invention.

Embodiments of the present invention are described in detail below. FIG. 1 is a sectional view schematically showing a configuration of a semiconductor laser device according to an embodiment of the present invention.

As shown in FIG. 1, a semiconductor laser device 1 according to an embodiment of the present invention includes, in this order on a substrate 2, a first n-type buffer layer 3, a second n-type buffer layer 4, an n-type clad layer 5, an n-type guide layer 6, an active layer 7, a p-type guide layer 8, a p-type lower clad layer 9a, a p-type upper clad layer 9b, and a p-type cap layer 10. Also, an n-side electrode 12 is disposed on the lower surface of the substrate 2. In addition, a p-side electrode 13 is disposed on the upper surface of the p-type cap layer 10. The p-type upper clad layer 9b and the p-type cap layer 10 are partially removed to form a waveguide having a stripe shape as viewed from the upper surface. In addition, a dielectric film 11 is formed so as to cover the upper surface of the p-type lower clad layer 9a and the side surfaces of the p-type upper clad layer 9b and the p-type cap layer 10.

The substrate 2 is composed of a material used for supporting the laser device. For example, the substrate 2 is an n-type GaAs substrate to which Si is added.

The first n-type buffer layer 3 and the second n-type buffer layer 4 are each composed of a material for improving the flatness of each of the semiconductor layers and relieving difference between the lattice constants of the substrate 2 and the n-type clad layer 5. For example, the first n-type buffer layer 3 is composed of GaAs to which Si is added, and the second n-type buffer layer 4 is composed of GaInP to which Si is added. Either or both of the first n-type buffer layer 3 and the second n-type buffer layer 4 can be omitted.

The n-type clad layer 5 is composed of an AlGaInPAs-based material which confines laser-oscillated light in the n-type guide layer 6 and the active layer 7 described below. For example, the n-type clad layer 5 is composed of AlGaInP to which Si is added.

The n-type guide layer 6 is composed of an AlGaInPAs-based material which confines laser-oscillated light in the active layer 7 described below. For example, the n-type guide layer 6 is composed of AlGaInP. An n-type dopant may be added or not added to the n-type guide layer 6 during lamination.

The active layer 7 is composed of an AlGaInPAs-based material which has a quantum well and causes light-emitting recombination of electrons and holes. In addition, the active layer 7 may be a multiple quantum well layer including plural barrier layers and plural well layers. For example, a barrier layer is composed of AlGaInP, and a well layer is composed of GaInP. The mixed-crystal ratio in the well layer can be arbitrarily adjusted according to the wavelength of the oscillated laser.

The p-type guide layer 8 is composed of an AlGaInPAs-based material which confines laser-oscillated light into the active layer 7. For example, the p-type guide layer 8 is composed of AlGaInP. A p-type dopant may be added or not added to the p-type guide layer 8 during lamination.

The p-type lower clad layer 9a is composed of an AlGaInPAs-based material which confines generated light into the active layer 7. For example, the p-type lower clad layer 9a is composed of AlInP to which Mg is added.

The p-type upper clad layer 9b is composed of an AlGaInPAs-based material which confines generated light into the active layer 7 described below. For example, the p-type upper clad layer 9b is composed of AlInP to which Mg is added. Also, the p-type upper clad layer 9b has a stripe shape in the longitudinal direction as viewed from the upper surface of the laser device and has the function of a waveguide which confines carriers and the light generated in the active layer 7.

In addition, an etching stop layer (not shown) may be formed between the p-type lower clad layer 9a and the p-type upper clad layer 9b. The etching stop layer is composed of an AlGaInPAs-based material which prevents etching of the lower clad layer in the step of forming a waveguide by etching described below. For example, the etching stop layer is composed of AlGaInP. In addition, the etching stop layer can be omitted. The p-type lower clad layer 9a and the p-type upper clad layer 9b may be composed of the same material or different materials. In the description below, the p-type lower clad layer 9a and the p-type upper clad layer 9b are together generically referred to as a "p-type clad layer 9".

The p-type cap layer 10 is composed of an AlGaInPAs-based material which makes electrical contact with the p-side electrode 13 described below. For example, the p-type cap layer 10 is composed of GaAs to which C is added. Like in the p-type upper clad layer, the p-type cap layer 10 has a stripe shape in the longitudinal direction as viewed from the upper surface of the laser device.

The n-side electrode 12 is formed to cover at least a portion of the lower surface of the substrate 2 and may include a single layer or plural layers. The n-side electrode 12 is composed of a material which makes electrical contact with the substrate 2, and examples thereof include Ti, W, Ta, Nb, Ni, and Pt.

The p-side electrode 13 is formed to cover at least a portion of the upper surface of the p-type cap layer 10 and may include a single layer or plural layers. The p-side electrode 13 is composed of a material which makes electrical contact with the p-type cap layer 10, and examples thereof include Ti, W, Ta, Nb, Ni, and Pt.

The dielectric film 11 is formed to cover the upper surface of the p-type lower clad layer 9a (or the etching stop layer) and the side surfaces of the p-type upper clad layer 9b and the p-type cap layer 10, which are exposed on both sides of the waveguide. The dielectric film 11 is composed of a material having electrical insulation, and examples thereof include aluminum oxide, silicon oxide, zirconia, silicon nitride, aluminum nitride, gallium nitride, silicon oxynitride, and aluminum oxynitride.

Although not shown in the drawings, a coating film may be formed on the two end surfaces of the waveguide of the semiconductor laser device 1. The coating film protects the end surfaces of the waveguide and controls the reflectivity of laser light. One of the end surfaces, which serves as an emission surface of laser light, is formed to have a lower reflectivity than that of the other end surface serving as a reflection surface of laser light. The material of the coating film is, for example, an $Al_2O_3/SiO_2$ laminated structure. In addition, the coating film on either or both of the emission surface and the reflection surface can be omitted.

Figure 2:
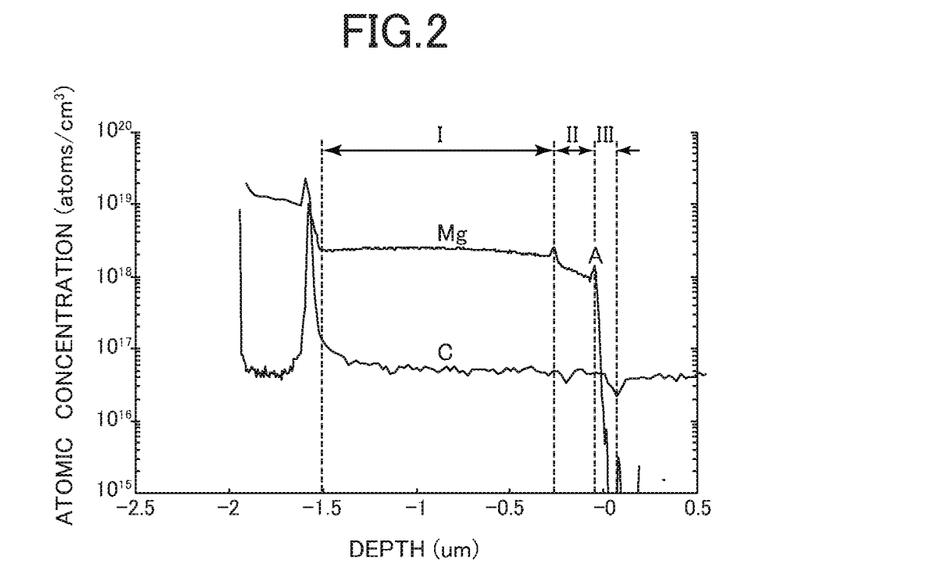
FIG. 2 is a profile of the Mg atomic concentration in the lamination direction of a semiconductor laser device according to an embodiment of the present invention.

FIG. 2 shows the atomic concentrations of Mg and C in the lamination direction of the semiconductor laser device 1 according to the embodiment. The atomic concentrations were measured by SIMS (Secondary Ion Mass Spectrometry) after annealing of a wafer. In the graph, the abscissa indicates the depth in the lamination direction from the center of the active layer 7 as a reference, and the direction to the substrate 2 is denoted by plus sign, and the direction to the p-type cap layer 10 is denoted as by minus sign. In this case, the center of the active layer 7 represents the center in the lamination direction from the first well layer to the second well layer with the barrier layer interposed therebetween. In the drawing, section I corresponds to the p-type upper clad layer 9b, section II corresponds to the p-type lower clad layer 9a, and section III corresponds to the p-type guide layer 8, the active layer 7, and the n-type guide layer 6. In addition, the ordinate in the graph indicates the atomic concentration.

As shown by A in FIG. 2, the embodiment is configured so as to have, for example, between the p-type guide layer 8 and the p-type clad layer 9, a Mg atomic concentration peak which suppresses inflow of the electrons, moving from the n-type clad layer 5 to the active layer 7, into the p-type guide layer 8 or the p-type clad layer 9. The peak need not necessarily have the highest absolute Mg concentration. Also, the peak may be a portion, that is, a pileup peak, where the Mg concentration steeply increases between the p-type guide layer 8 and the p-type clad layer 9. Therefore, a laser having low current loss even in a high-temperature environment can be formed. Specific description is given blow.

The Mg atomic concentration peak between the p-type guide layer 8 and the p-type clad layer 9 becomes an energy barrier for the electrons moving from the active layer 7 to the p-type guide layer 8 or the p-type clad layer 9. Even when a laser is oscillated in a high-temperature environment, the inflow of electrons from an n-type to a p-type layer, that is, carrier overflow, can be suppressed by the barrier. By suppressing the carrier overflow, non-light-emitting recombination of electrons and holes in the p-type layer can be suppressed, thereby decreasing the current loss.

The embodiment has the Mg atomic concentration peak between the p-type guide layer 8 and the p-type clad layer 9. The peak makes unnecessary an excessive layer, for example, a so-called anti-diffusion layer for preventing diffusion of the excessively added Mg to the active layer, and thus the resistance can be decreased and the carrier overflow can be suppressed, thereby decreasing the current loss.

The embodiment has the Mg atomic concentration peak between the p-type guide layer 8 and the p-type clad layer 9. The peak makes unnecessary an excessive layer, for example, a layer having a high Al composition ratio and high energy barrier, near the active layer 7, and thus the resistance can be decreased and the carrier overflow can be suppressed, thereby decreasing the current loss.

In addition, C is more preferably added as a dopant to the p-type cap layer 10. This can decrease the laser oscillation threshold value as compared with other dopant materials such as Zn and the like. Specific description is given below by using FIG. 3.

Figure 3:
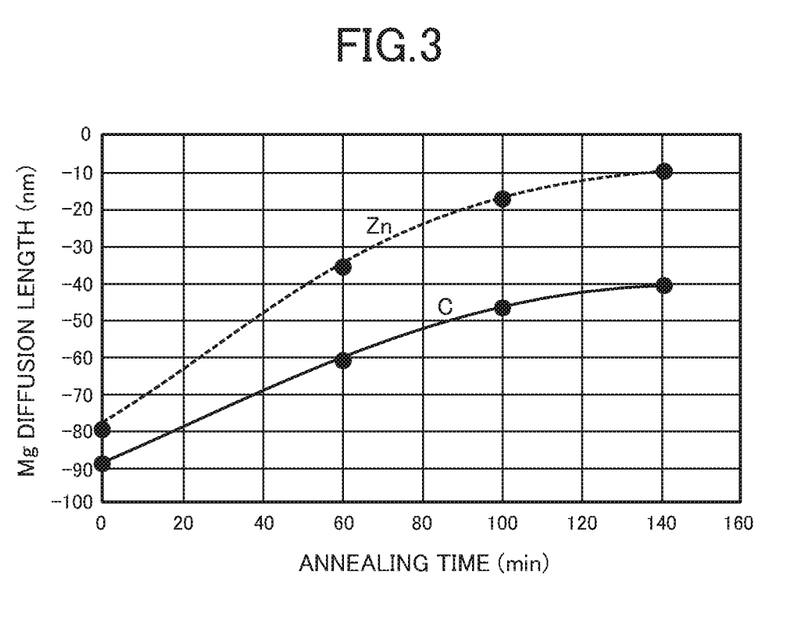
FIG. 3 is a graph showing the length (so-called Mg diffusion length) in the lamination direction from a central position of an active layer to a position at a Mg concentration of $1.0 \times 10^{17}$ cm$^{-3}$ when annealing, for different times, each of a wafer according to an embodiment and a wafer having a configuration different from the embodiment in that Zn is added in place of C as a dopant of a p-type cap layer 10.

FIG. 3 is a graph showing Mg diffusion in the p-type clad layer 9 when annealing, in an annealing furnace for 0, 60, 120, and 180 minutes, each of a wafer formed according to an embodiment and a wafer formed to have a configuration different from the embodiment in that Zn is added in place of C as a dopant of a p-type cap layer 10. In the graph, the abscissa indicates the annealing time, and the ordinates indicates the distance (so-called Mg diffusion length) from the center of the active layer 7 to a position at a Mg concentration of $1.0 \times 10^{17}$ cm$^{-3}$ in the lamination direction of the p-type layer. The Mg diffusion length is denoted by the distance with minus sign to the p-type cap layer 10.

As shown in FIG. 3, even when any one of C and Zn is added, Mg is diffused closer to the active layer 7 with increases in the annealing time. However, when C is added, Mg diffusion is smaller than that when Zn is added. In addition, the longer the annealing time is, the more remarkable the difference in Mg diffusion between Zn and C becomes.

The diffusion of C added to the p-type cap layer 10 into the clad layer 9 by annealing is smaller than that of Zn. In addition, C diffused into the p-type clad layer 9 has the smaller function of promoting Mg diffusion from the clad layer 9 to the active layer 7 as compared with Zn. Therefore, when C is added, the Mg concentration in the active layer is lower than that when Zn is added. The lower Mg concentration in the active layer decreases the laser oscillation threshold value due to a decrease in non-light-emitting recombination of electrons and holes in the active layer. Therefore, it is more advantageous to add C as a dopant to the p-type cap layer 10 because the laser oscillation threshold value is more decreased than when another material such as Zn or the like is added.

Thus, as shown in FIG. 2, the Mg atomic concentration peak is more preferably present at the interface between the p-type guide layer 8 and the p-type clad layer 9 because the current loss is further decreased. Specific description is given below.

The embodiment has the Mg atomic concentration peak at the interface between the p-type guide layer 8 and the p-type clad layer 9. The peak is present in a region near the active layer 7 and severs as the energy barrier for the electrons moving from the active layer 7 to the p-type guide layer 8, thereby suppressing the carrier overflow and, at the same time, facilitating the confinement of electrons in the active layer 7 and more increasing the light-emitting recombination. Therefore, the current loss is further decreased.

In addition, the embodiment has the Mg atomic concentration peak at the interface between the p-type guide layer 8 and the p-type clad layer 9. The peak makes it unnecessary to form a high-energy barrier for electrons by, for example, adding excessive Mg to the p-type guide layer 8, and thus it is possible to suppress the carrier overflow while suppressing excessive Mg diffusion into the active layer 7, thereby further decreasing the current loss.

As shown in FIG. 2, in the embodiment, the Mg atomic concentration at the interface between the p-type guide layer 8 and the p-type clad layer 9 is $1.4 \times 10^{18}$ cm$^{-3}$, and the Mg atomic concentration has a peak at $1.0 \times 10^{18}$ cm$^{-3}$ or more and $6.0 \times 10^{18}$ cm$^{-3}$ or less. The Mg atomic concentration at the center of the active layer 7 is $1.4 \times 10^{16}$ cm$^{-3}$ and is $5.0 \times 10^{17}$ cm$^{-3}$ or less. In the embodiment, the Mg atomic concentration at the center of the active layer 7 is about 1/100 of the Mg atomic concentration at the interface between the p-type guide layer 8 and the p-type clad layer 9. That is, it can be confirmed that the embodiment has ha the high Mg concentration peak while maintaining the sufficiently low Mg concentration in the active layer and thus has the effect of suppressing the carrier overflow and further decreasing the current loss.

In this case, the Mg atomic concentration at the interface between the p-type guide layer 8 and the p-type clad layer 9 is preferably $1.0 \times 10^{18}$ cm$^{-3}$ or more and $6.0 \times 10^{18}$ cm$^{-3}$ or less. With the Mg concentration of $1.0 \times 10^{18}$ cm$^{-3}$ or more, the effect of suppressing the carrier overflow is increased, and the current loss is decreased. While with the Mg concentration of $6.0 \times 10^{18}$ cm$^{-3}$ or less, the diffusion of excessive Mg to the active layer 7 is decreased, and thus the non-light-emitting recombination of electrons and holes is decreased, thereby decreasing the laser oscillation threshold value.

Also, the Mg atomic concentration in the active layer 7 is preferably $5.0 \times 10^{17}$ cm$^{-3}$ or less. When the Mg atomic concentration in the active layer 7 is $5.0 \times 10^{17}$ cm$^{-3}$ or less, the non-light-emitting recombination of electrons and holes is decreased, and the laser oscillation threshold value is decreased.

In addition, the Mg atomic concentration at the interface between the p-type guide layer 8 and the active layer 7 is preferably $3.0 \times 10^{18}$ cm$^{-3}$ or less. When the Mg atomic concentration is $3.0 \times 10^{18}$ cm$^{-3}$ or less, the diffusion of excessive Mg to the adjacent active layer 7 is suppressed, and the non-light-emitting recombination of electrons and holes is decreased, thereby decreasing the laser oscillation threshold value.

As shown in FIG. 2, in the embodiment, the Mg atomic concentration at the interface between the active layer 7 and the p-type guide layer 8 is $2.6 \times 10^{17}$ cm$^{-3}$ and is thus $3.0 \times 10^{18}$ cm$^{-3}$ or less. The Mg atomic concentration at the center of the active layer 7 is $1.4 \times 10^{16}$ cm$^{-3}$. That is, in the embodiment, the Mg atomic concentration at the center of the active layer 7 is about 1/18 of the Mg atomic concentration at the interface between the active layer 7 and the p-type guide layer 8, and thus it can be confirmed that the sufficiently low Mg concentration in the active layer causes the effect of decreasing the laser oscillation threshold value.

In order to realize the configuration of the embodiment, the p-type clad layer 9 composed of AlInP to which Mg is added as a dopant is laminated at a temperature lower than the lamination temperature of the p-type guide layer 8 composed of AlGaInP, and thus a laser device having low current loss even in a high-temperature environment and a small laser oscillation threshold value can be formed. Specific description is given below by using FIG. 4.

Figure 4:
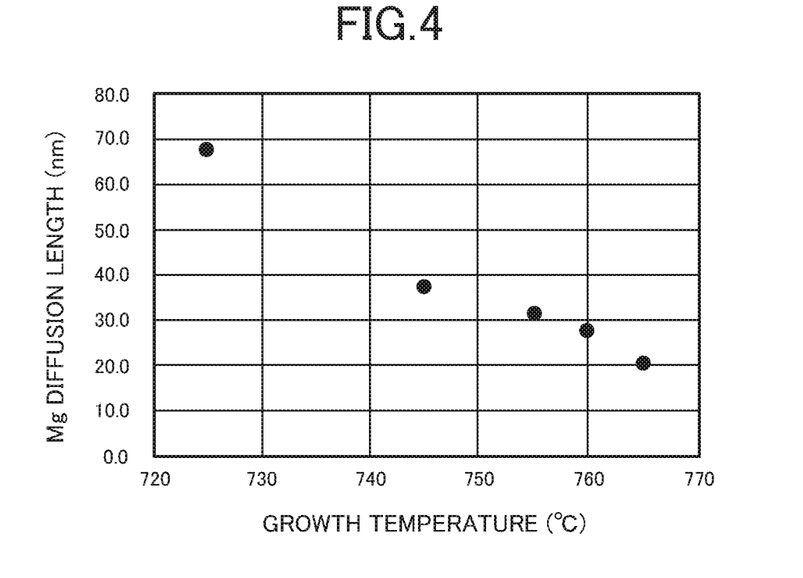
FIG. 4 is a graph showing the amounts of change in the Mg diffusion length before and after annealing with different crystal growth temperatures for a p-type clad layer in an embodiment.

FIG. 4 is a graph showing the amounts of change in the Mg diffusion length before and after annealing with different growth temperatures for respective five wafers having the same configuration as that of the embodiment except that only the p-type clad layers 9 are laminated. The all wafers were annealed at 650° C. for 60 minutes. In the graph, the abscissa indicates the growth temperatures of the p-type clad layers 9, and the ordinate indicates the amounts of change in Mg diffusion length before and after annealing. The lower the growth temperature of the p-type clad layer 9, the larger the Mg diffusion from the p-type clad layer 9 near to the active layer 7 before and after annealing. In particular, the diffusion becomes remarkable at the growth temperature of 745° C. or less.

By using the characteristics described above, the amount of Mg diffusion to the active layer can be controlled by making a relative difference between the growth temperature of the p-type guide layer 8 and the growth temperature of the p-type clad layer 9. Specifically, the growth temperature of the clad layer 9 is set to be lower than that of the p-type guide layer 8. Thus, the Mg diffusion rate in the p-type clad layer 9 is increased, while the Mg diffusion rate in the p-type guide layer 8 is decreased. This causes a change in Mg diffusion rate at the interface between the p-type guide layer 8 and the p-type clad layer 9 in the annealing step. Therefore, the interface has the effect as a barrier for limiting the Mg diffusion to the active layer 7. As a result, the Mg diffused from the p-type clad layer 9 stagnates at the interface, and thus the concentration is rapidly increased, thereby easily forming pileup shown by A in FIG. 2.

In the embodiment, the Mg pileup is present at the interface between the p-type guide layer 8 and the p-type clad layer 9, and thus the energy barrier for the electrons moving from the active layer 7 to the guide layer 8 or the clad layer 9 can be formed in a region near the active layer 7. Thus, it is possible to suppress the carrier overflow and suppress the non-light-emitting recombination in the p-type layers, thereby forming a laser having low current loss even in a high-temperature environment.

When the Mg diffused from the p-type clad layer 9 stagnates at the interface, the Mg diffusion to the active layer 7 is decreased, and thus the Mg concentration in the active layer 7 is decreased. Therefore, the non-light-emitting recombination of electrons and holes in the active layer 7 is suppressed, and thus a laser having a low oscillation threshold value can be formed.

Next, an example of the method for producing the semiconductor laser device according to the embodiment is described. In the description below, the method for producing an AlGaInPAs-based semiconductor laser device using a MOCVD method (metal organic chemical vapor deposition method) is described as an example.

First, the n-type clad layer 5 is laminated on the substrate 2. Specifically, for example, the substrate 2 composed of n-type GaAs is placed in a MOCVD apparatus and heated at 770° C. Next, the first buffer layer 3 of 0.1 μm composed of Si—GaAs and the second buffer layer 4 of 0.2 μm composed of Si—Ga$_{0.5}$In$_{0.5}$P are laminated, and then the n-type clad layer 5 of 1 μm composed of Si—(Al$_{0.9}$Ga$_{0.1}$)$_{0.5}$In$_{0.5}$P is laminated.

Next, the n-type guide layer 6 is laminated. Specifically, for example, the n-type guide layer 6 of 0.5 μm composed of undoped (Al$_{0.65}$Ga$_{0.35}$)$_{0.5}$In$_{0.5}$P is laminated on the n-type clad layer 5.

Next, the active layer 7 is laminated. Specifically, for example, the well layer composed of undoped Ga$_{0.5}$In$_{0.5}$P and the barrier layer composed of undoped (Al$_{0.65}$Ga$_{0.35}$)$_{0.5}$In$_{0.5}$P are laminated on the n-type guide layer 6, and again the well layer composed of undoped Ga$_{0.5}$In$_{0.5}$P is laminated. The mixed-crystal ratio and thickness of the well layer are properly adjusted so as to produce oscillation at a laser wavelength of 640 nm.

Next, the p-type guide layer 8 composed of AlGaInP is laminated at a first temperature. Specifically, for example, the p-type guide layer 8 of 0.5 μm composed of undoped (Al$_{0.65}$Ga$_{0.35}$)$_{0.5}$In$_{0.5}$P is laminated on the active layer 7 while the substrate 2 is maintained at 770° C.

Next, the p-type clad layer 9 composed of AlInP to which Mg is added as a dopant is laminated at a second temperature lower than the first temperature. Specifically, for example, the temperature of the substrate 2 is decreased to 720° C., and then the p-type lower clad layer 9a of 0.05 μm composed of Mg—Al$_{0.5}$In$_{0.5}$P, the etching stop layer of 0.01 μm composed of (Al$_{0.05}$Ga$_{0.95}$)$_{0.5}$In$_{0.5}$P, and the p-type upper clad layer 9b of 1.2 μm composed of Mg—Al$_{0.5}$In$_{0.5}$P are sequentially laminated. In this case, in laminating the p-type lower clad layer 9a and the p-type upper clad layer 9b, biscyclopentadienyl magnesium (Cp$_2$Mg) as a material gas is supplied so that the Mg atomic concentration is $2.0 \times 10^{18}$ cm$^{-3}$ in a state before the annealing step described below.

In the embodiment, the growth temperature of the p-type clad layer 9 is lower than that of the p-type guide layer 8. Thus, the Mg diffused from the p-type clad layer 9 stagnates at the interface between the p-type guide layer 8 and the p-type clad layer 9 in the annealing step described below, thereby forming Mg pileup. Also, the Mg diffusion to the active layer is suppressed, and thus a laser having low current loss even in a high-temperature environment and a low laser oscillation threshold value can be formed.

Next, the p-type cap layer 10 composed of GaAs to which C is added as a dopant is laminated. Specifically, for example, the temperature of the substrate 2 is decreased to 570° C., and then the cap layer of 0.5 m composed of C—GaAs is laminated. In this case, in forming the p-type cap layer 10, CBr$_4$ as a material gas is supplied so that the C atomic concentration is $3.0 \times 10^{19}$ cm$^{-3}$ in a state before the annealing step described below.

Next, the temperature of the substrate 2 is decreased to room temperature, producing a wafer including the semiconductor multilayer film laminated on the substrate 2.

Next, the substrate 2 on which the multilayer film has been laminated is annealed. The annealing is performed by any desired method, and specifically, for example, the wafer including the semiconductor multilayer film laminated on the substrate 2 is placed in a nitrogen atmosphere in an annealing furnace and annealed at 650° C. for 60 minutes.

Next, the waveguide is formed on the annealed wafer. The waveguide is formed by any desired photolithography and etching method, and specifically, for example, a portion corresponding to the waveguide on the wafer is masked with a photoresist, and the unmasked portions of the p-type cap layer 10 and the p-type upper clad layer 9b are removed by dry etching to a depth reaching the etching stop layer. Finally, the mask is removed to produce the wafer having the waveguide formed thereon.

Next, in the wafer having the waveguide formed thereon, the dielectric film 11 is formed on the exposed surface of the p-type lower clad layer 9a or of the etching stop layer and on the side surface of the waveguide. The dielectric film 11 is formed by any desired method, and specifically, for example, $SiO_2$ is first formed on the surface of the wafer by an electron cyclotron resonance plasma-enhanced chemical vapor deposition (ECR plasma-enhanced CVD) method. Next, $SiO_2$ on the waveguide is removed by photolithography, forming the wafer having the dielectric film 11 formed thereon.

Next, the n-side electrode 12 and the p-side electrode 13 are formed on the wafer having the dielectric film 11 formed thereon. The n-side electrode 12 and the p-side electrode 13 are formed by any desired method, and specifically, for example, Ti/Au is laminated on both surfaces of the wafer by vacuum vapor deposition and then patterned by photolithography to produce the wafer on which the n-side electrode 12 and the p-side electrode 13 have been formed.

Next, the wafer on which the n-side electrode 12 and the p-side electrode 13 have been formed is divided into a bar shape. The divided bar shape is formed by any desired method, and specifically, for example, the wafer is cleaved at intervals corresponding to the length of a resonator of the semiconductor laser device 1 in the direction perpendicular to the waveguide, producing a divided laser part having a bar shape. One of the cleavage planes of the bar-shaped laser part serves as a laser emission surface, and the other cleavage plane serves as a laser reflection surface.

Next, a coating film is formed on each of the cleavage planes of the bar-shaped divided laser part. The coating film is formed by any desired method and, specifically, for example, $Al_2O_3$ and $SiO_2$ are repeatedly laminated on one of the cleavage planes of the bar-shaped divided laser part by sputtering, forming the laser emission surface. In addition, $Al_2O_3$ and $SiO_2$ are repeatedly laminated on the other cleavage plane, forming the laser reflection surface.

Finally, the bar-shaped laser part having the coating film formed thereon is divided into a device unit by any desired method, forming the AlGaInPAs-based semiconductor laser device 1.

In order to verify the effect of the embodiment, semiconductor laser devices having a comparative structure 1 to a comparative structure 3 having different conditions are formed.

[Comparative Structure 1]

The semiconductor laser device with the comparative structure 1 is different from the embodiment in that Zn is added as a dopant of the p-type cap layer. Also, the comparative structure 1 is different from the embodiment in that the growth temperature of the p-type lower clad layer, the etching stop layer, and the p-type upper clad layer is 770° C. which is the same as that of the p-type guide layer. In forming the p-type cap layer, dimethyl zinc (DMZn) as a material gas is supplied so that the Zn atomic concentration in a state before the annealing step is $3.0 \times 10^{19}$ cm$^{-3}$.

Figure 5:
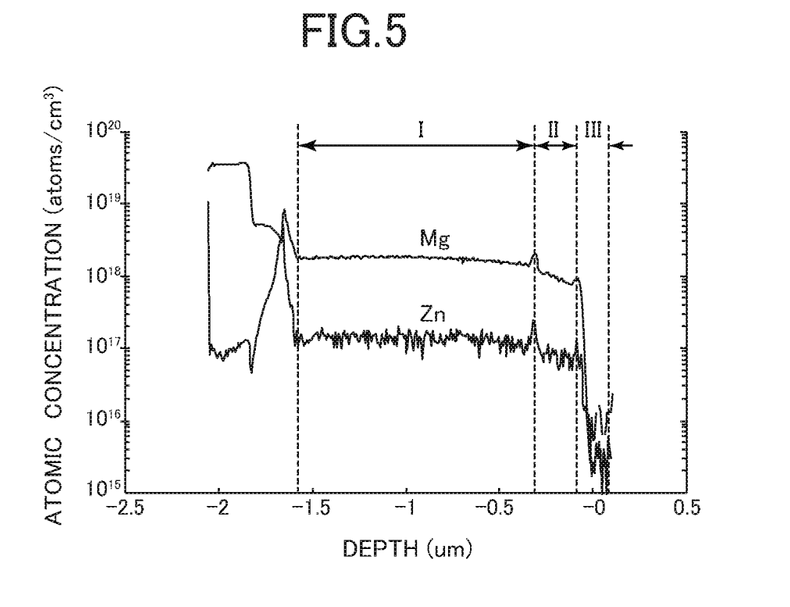
FIG. 5 shows the profiles of Zn and Mg atomic concentrations in the lamination direction of a semiconductor laser device (comparative structure 1) produced by laminating a p-type clad layer at a growth temperature different from in an embodiment and adding Zn in place of C as a dopant of a p-type cap layer.

FIG. 5 shows the atomic concentration profiles of Mg and Zn, after annealing, in the lamination direction from the p-type cap layer to the active layer in the semiconductor structure of the comparative structure 1. The denotation method of the graph is the same as in FIG. 2.

In the comparative structure 1, the Mg atomic concentration at the interface between the p-type guide layer and the p-type clad layer is $6.8 \times 10^{17}$ cm$^{-3}$, the Mg atomic concentration at the interface between the active layer and the p-type guide layer is $4.8 \times 10^{17}$ cm$^{-3}$, and the Mg atomic concentration at the center of the active layer is $3.2 \times 10^{16}$ cm$^{-3}$. The Mg concentration at the interface between the p-type guide layer and the p-type clad layer is lower than that in the embodiment, and only a little pileup occurs. Further, the Mg concentration at the center of the active layer is higher than that of the embodiment and is about ½1 of the Mg atomic concentration at the interface between the p-type guide layer and the p-type clad layer. In addition, in the embodiment, the C atomic concentration in the p-type clad layer is $6.0 \times 10^{16}$ cm$^{-3}$ on average, while in the comparative structure 1, the Zn atomic concentration in the p-type clad layer is $1.0 \times 10^{17}$ cm$^{-3}$ on average.

In comparison with the comparative structure 1, in the embodiment, C is added as a dopant of the p-type cap layer 10, thereby causing small C diffusion to the p-type clad layer 9 by annealing. Further, C in the p-type clad layer 9 has the smaller function of promoting the Mg diffusion from the p-type clad layer 9 to the active layer 7 as compared with Zn. Therefore, when C is added, the Mg concentration in the active layer is lower than when Zn is added. With the lower Mg concentration in the active layer, the non-light-emitting recombination of electrons and holes in the active layer is decreased, thereby decreasing the laser oscillation threshold value. Therefore, the embodiment is advantageous because of the decreased laser oscillation threshold value.

In comparison with the comparative structure 1, in the embodiment, the growth temperature of the p-type clad layer 9 is lower than the p-type guide layer 8. Therefore, Mg diffused from the clad layer 9 stagnates at the interface between the p-type guide layer 8 and the p-type clad layer 9 in the annealing step, thereby forming Mg pileup. In addition, Mg diffusion to the active layer is suppressed, and thus it is possible to form a laser having low current loss even in high-temperature environment and a low laser oscillation threshold value.

[Comparative Structure 2]

A semiconductor laser device with the comparative structure 2 is different from the embodiment in that the growth temperature of the p-type lower clad layer, the etching stop layer, and the p-type upper clad layer is 770° C. which is the same as that of the p-type guide layer.

Figure 6:
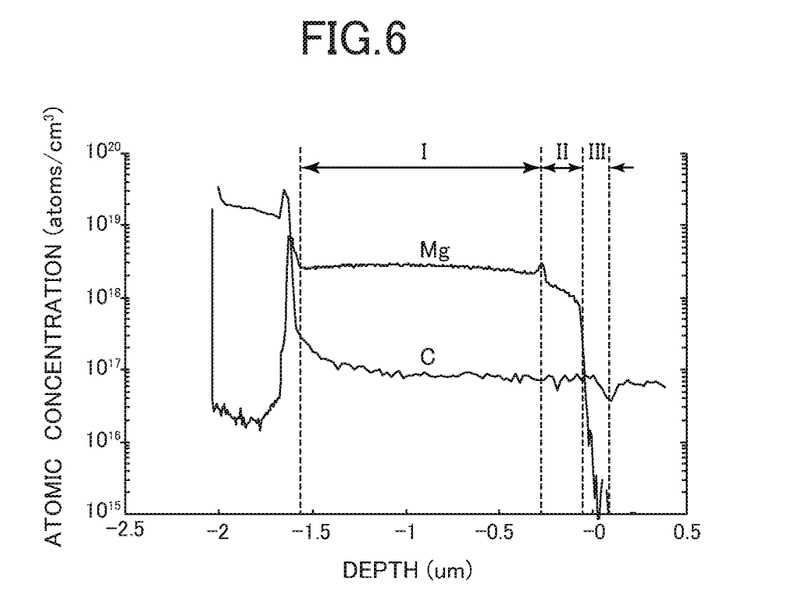
FIG. 6 shows the profiles of C and Mg atomic concentrations in the lamination direction of a semiconductor laser device (comparative structure 2) produced by laminating a p-type clad layer at a growth temperature different from in an embodiment.

FIG. 6 shows the atomic concentration profiles of Mg and C in the lamination direction of the semiconductor structure after annealing of the comparative structure 2. The denotation method of the graph is the same as in FIG. 2.

In the comparative structure 2, the Mg atomic concentration at the interface between the p-type guide layer and the p-type lower clad layer is $4.2 \times 10^{17}$ cm$^{-3}$, the Mg atomic concentration at the interface between the active layer and the p-type guide layer is $6.0 \times 10^{15}$ cm$^{-3}$, and the Mg atomic concentration at the center of the active layer is $6.4 \times 10^{15}$ cm$^{-3}$. The C atomic concentration in the p-type clad layer is $6.0 \times 10^{16}$ cm$^{-3}$ on average. In comparison with the embodiment, the Mg atomic concentration at the center of the active layer is low, but the Mg concentration at the interface between the p-type guide layer and the p-type lower clad layer is low, and the Mg pileup is not formed at the interface between the p-type guide layer and the p-type lower clad layer.

In comparison with the comparative structure 2, in the embodiment, the growth temperature of the clad layer 9 is lower than that of the p-type guide layer 8. Therefore, Mg diffused from the clad layer 9 stagnates at the interface between the p-type guide layer 8 and the p-type clad layer 9 in the annealing step, thereby forming Mg pileup, and thus it is possible to form a laser having low current loss even in high-temperature environment.

[Comparative Structure 3]

The semiconductor laser device with the comparative structure 3 is different from the embodiment in that Zn is added as a dopant of the p-type cap layer. Also, in forming the p-type cap layer, dimethyl zinc (DMZn) used as a material gas is supplied so that the Zn atomic concentration in a state before the annealing step is $3.0 \times 10^{19}$ cm$^{-3}$.

Figure 7:
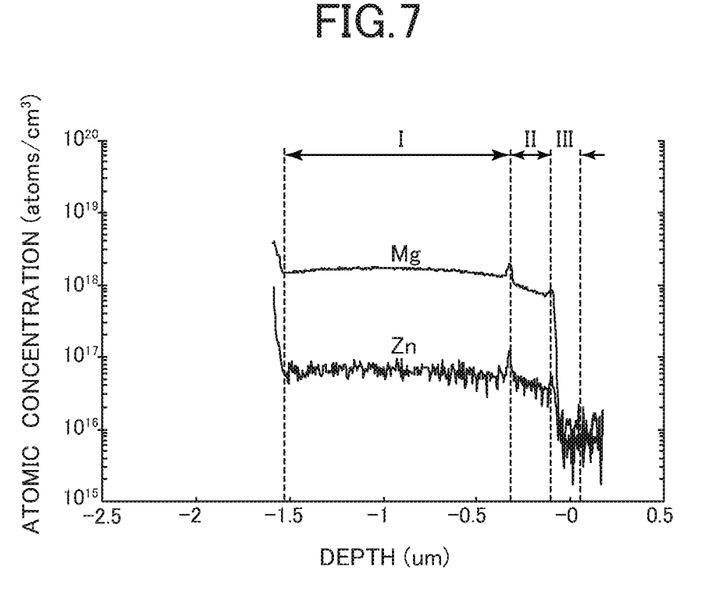
FIG. 7 shows the profiles of Zn and Mg atomic concentrations in the lamination direction of a semiconductor laser device (comparative structure 3) produced by adding Zn in place of C as a dopant of a p-type cap layer.

FIG. 7 shows the atomic concentration profiles of Mg and C in the lamination direction after annealing of the comparative structure 3. The denotation method of the graph is the same as in FIG. 2.

In the comparative structure 3, the Mg atomic concentration at the interface between the p-type guide layer and the p-type lower clad layer is $9.1 \times 10^{17}$ cm$^{-3}$, the Mg atomic concentration at the interface between the active layer and the p-type guide layer is $8.5 \times 10^{17}$ cm$^{-3}$, and the Mg atomic concentration at the center of the active layer is $6.5 \times 10^{16}$ cm$^{-3}$. The Zn concentration in the p-type clad layer is $8.0 \times 10^{16}$ cm$^{-3}$ on average. In addition, the Mg concentration at the interface between the p-type guide layer and the p-type lower clad layer is lower than that in the embodiment, and only a little pileup occurs. Further, the Mg concentration at the center of the active layer is higher than that of the embodiment and is about 1/14 of the Mg atomic concentration at the interface between the p-type guide layer and the p-type lower clad layer.

In comparison with the comparative structure 3, in the embodiment, C is added as a dopant of the p-type cap layer 10, and thus C diffusion to the p-type clad layer 9 by annealing is small. Further, C in the p-type clad layer 9 has the smaller function of promoting Mg diffusion from the p-type clad layer 9 to the active layer 7 as compared with Zn. Therefore, when C is added, the Mg concentration in the active layer is lower than that of Zn. With the lower Mg concentration in the active layer, the non-light-emitting recombination of electrons and holes in the active layer is decreased, thereby decreasing the laser oscillation threshold value. Therefore, the embodiment is advantageous because of the decreased laser oscillation threshold value.

The present invention is not limited to the embodiments described above, and various modifications can be made within the scope described in the claims. The technical scope of the present invention also includes an embodiment obtained by appropriately combining the technical methods disclosed in respective difference embodiments. Further, a new technical feature can be formed by combining the technical methods disclosed in the respective embodiments.

The invention claimed is:

1. An AlGaInPAs-based semiconductor laser device comprising:
    a substrate;
    an n-type clad layer;
    an n-type guide layer;
    an active layer;
    a p-type guide layer composed of AlGaInP containing Mg as a dopant;
    a p-type clad layer composed of AlInP containing Mg as a dopant, and the p-type clad layer including a p-type lower clad layer and a p-type upper clad layer on a part of the p-type lower clad layer;
    a p-type cap layer, on the p-type upper clad layer, composed of GaAs; and
    a dielectric film covering an upper surface of the p-type lower clad layer, a side surface of the p-type upper clad layer, and a side surface of the p-type cap layer,
    wherein the semiconductor laser device has, between the p-type guide layer and the p-type clad layer, a Mg-atomic concentration peak which suppresses inflow of electrons moving from the n-type clad layer to the active layer, and into the p-type guide layer or the p-type clad layer.

2. The AlGaInPAs-based semiconductor laser device according to claim 1, wherein the p-type cap layer contains C as a dopant.

3. The AlGaInPAs-based semiconductor laser device according to claim 1, wherein the Mg-atomic concentration peak is present at an interface between the p-type guide layer and the p-type clad layer.

4. The AlGaInPAs-based semiconductor laser device according to claim 3, wherein a Mg-atomic concentration at the interface between the p-type guide layer and the p-type clad layer is $1.0 \times 10^{18}$ cm$^{-3}$ or more and $6.0 \times 10^{18}$ cm$^{-3}$ or less.

5. The AlGaInPAs-based semiconductor laser device according to claim 1, wherein a Mg-atomic concentration in the active layer is $5.0 \times 10^{17}$ cm$^{-3}$ or less.

6. The AlGaInPAs-based semiconductor laser device according to claim 1, wherein a Mg-atomic concentration at an interface between the p-type guide layer and the active layer is $3.0 \times 10^{18}$ cm$^{-3}$ or less.

\* \* \* \* \*